(12) United States Patent
Shiraishi

(10) Patent No.: US 6,377,077 B1
(45) Date of Patent: Apr. 23, 2002

(54) CLOCK SUPPLY CIRCUIT AND DATA TRANSFER CIRCUIT

(75) Inventor: Mikio Shiraishi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/258,820

(22) Filed: Feb. 26, 1999

(30) Foreign Application Priority Data

Mar. 19, 1998 (JP) .......................................... 10-070820

(51) Int. Cl.[7] .............................................. H03K 19/00
(52) U.S. Cl. .............................. 326/93; 326/16; 326/46; 326/39; 326/40
(58) Field of Search .............................. 326/93, 95, 16; 375/357, 354

(56) References Cited

U.S. PATENT DOCUMENTS

| | | | | |
|---|---|---|---|---|
| 5,426,682 A | * | 6/1995 | Takatsu | 377/80 |
| 5,498,983 A | * | 3/1996 | Schoellkopf | 327/3 |
| 5,719,504 A | * | 2/1998 | Yamada | 326/16 |
| 5,883,529 A | * | 3/1999 | Kumata et al. | 326/93 |
| 5,987,081 A | * | 11/1999 | Csoppenszky et al. | 375/354 |
| 6,037,801 A | * | 3/2000 | Zhu | 326/46 |

\* cited by examiner

*Primary Examiner*—Michael Tokar
*Assistant Examiner*—Vibol Tan
(74) *Attorney, Agent, or Firm*—Oblon, Spivak, McClelland, Maier & Neustadt, P.C.

(57) ABSTRACT

A clock supply circuit for supplying a clock signal to a data transfer circuit, which comprises a plurality of stages of cascade-connected data signal input/output circuits and wherein the plurality of stages of data signal input/output circuits from a data signal input stage to a data signal output stage are divided into a plurality of groups, supplies a more phase-lagged clock signal to the data signal input/output circuit belonging to a group nearer the data signal input stage of the plurality of stages of data signal input/output circuit out of the plurality of groups. The data transfer circuit includes the clock supply circuit. Thus, it is possible to provide a clock supply circuit, which can prevent the malfunction of the circuit from being caused by clock skews and which can be applied to the design of various integrated circuits, and a data transfer circuit utilizing the clock supply circuit.

12 Claims, 8 Drawing Sheets

CLOCK SUPPLY CIRCUIT AND DATA TRANSFER CIRCUIT

BACKGROUND OF THE INVENTION

The present invention relates generally to a clock supply circuit and a data transfer circuit utilizing the clock supply circuit.

In recent years, the operating clock frequencies of integrated circuits have been remarkably improved, and application specific integrated circuits (ASICs), such as gate arrays and standard cells, which have an operating clock frequency of about 500 MHz, have been developed. This value of operating clock frequency is about 50 times as large as that of ten years ago, and contributes to the improvement of degree of integration of circuits and the expansion of application.

However, with the increase in operating clock frequency, the number of problems to be solved increases. The problems include measures against clock skews. The clock skew is a phenomenon caused by the fact that the phase difference between a clock signal and a data signal is different every part of an integrated circuit, and a phenomenon for causing the malfunction of the circuit when a data signal in a switching transient state or a data signal at a time different from a predetermined timing is stored in a resistor which is a backup memory for data signals. It is impossible to quantitatively analyze a clock skew until the layout of an integrated circuit is completed, and the resulting phenomenon is uncertain, so that it is often difficult to find a clock skew causing malfunction and it is often difficult to take measures to cope with the clock skew even if it is found. Conventionally, as measures taken to cope with the clock skew, the following two means have been adopted.

FIG. 1 is a schematic diagram for explaining first conventional clock skew eliminating means. In the first conventional clock skew eliminating means, a grid-like clock supply dedicated wiring 11 having buffers 2 on the input side of respective clock supply paths is provided to supply only a clock signal P0 via the clock supply dedicated wiring 11 to reduce the phase difference between a data signal and the clock signal P0 every part of an integrated circuit.

The first conventional clock skew eliminating means is particularly effective in integrated circuits, such as gate arrays and field programmable gate arrays (FPGAs), wherein the arrangement of circuits in the whole chip is previously determined. For example, as shown in the drawing, the grid-like clock supply dedicated wiring 11 is provided, so that it is possible to control a clock skew on the chip to be less than a certain value.

FIG. 2 is a schematic diagram for explaining second conventional clock skew eliminating means. In the second conventional clock skew eliminating means, a plurality of second stage buffers 2' are provided on the output side of a first stage buffer 2 provided in a clock supply path, and a plurality of third stage buffers 2" are provided on the output side of each of the second stage buffers 2'. Thus, a clock wiring branching at some stages of buffers is provided to design a circuit so that the output loads of the respective stages of buffers are as equally as possible. A plurality of stages of flip-flops 6 are connected to the downstream sides of the respective third stage buffers 2".

The first and second conventional clock skew eliminating means are often combined. However, there are the following problems in the above described first and second conventional clock skew eliminating means.

As described above, the first conventional clock skew eliminating means, i.e., the method using the clock supply dedicated wiring, is particularly effective in an integrated circuit wherein the arrangement of the circuit in the whole chip has been determined. However, in the case of an integrated circuit, such as a standard cell, wherein the arrangement of the circuit in the whole chip has not been determined at the first stage, it is difficult to design an ideal circuit since the arrangement of the clock supply dedicated wiring is designed at the same time that or after the arrangement of other signal lines is designed. Thus, the clock skew depends on the resulting layout. Therefore, there is a problem in that there are some cases where the clock skew can not be suppressed to be less than a required predetermined value.

In the second conventional clock skew eliminating means, e.g., in the method using a branching clock wiring for designing the circuit so that the output loads of the buffers in the respective stages are as equally as possible, it is required to design the clock wiring on the basis of engineer's manual calculation if the clock wiring is designed before the layout of the arrangement of the circuit, so that the engineer must very carefully design the clock wiring for a long time. On the other hand, if the circuit is automatically designed by means of a computer, the clock wiring is designed after the layout of the arrangement of the circuit. Therefore, there are problems in that it takes a long time to modify the layout of the arrangement of the circuit, and there are some cases where it is required to do over the layout of the whole chip again, so that the design is complicated so as not to be adopted to automation and it takes a long period of time to design the circuit.

As described above, the malfunction of a circuit due to clock skews is caused by the phase difference between a clock signal and a data signal. This is a local phenomenon in a chip by nature. However, the conventional clock skew eliminating means are designed to reduce the maximum value of the phase difference in a clock signal itself at the respective parts, and this reduction is carried out over the whole integral circuit. Therefore, there is a great waste of design from the standpoint of the prevention of malfunction.

SUMMARY OF THE INVENTION

It is therefore an object of the present invention to eliminate the aforementioned problems and to provide a clock supply circuit which can prevent the malfunction of a circuit from being caused by clock skews and which can be applied to the design of various integrated circuits, and a data transfer circuit utilizing the clock supply circuit.

In order to accomplish the aforementioned and other objects, according to a first aspect of the present invention, there is provided a clock supply circuit for supplying clock signals to a data transfer circuit, which comprises a plurality of stages of cascade-connected data signal input/output circuits and wherein the plurality of stages of data signal input/output circuits from a data signal input stage to a data signal output stage are divided into a plurality of groups, each including predetermined stages of the data signal input/output circuits, the clock supply circuit supplying a more phase-lagged clock signal to one of the data signal input/output circuits belonging to a group nearer the data signal input stage of the plurality of stages of data signal input/output circuits out of the plurality of groups.

Specifically, according to the first aspect of the present invention, there is provided a clock supply circuit for supplying clock signals to a data transfer circuit, which comprises a plurality of stages of cascade-connected data signal input/output circuits and wherein the plurality of stages of data signal input/output circuits from a data signal input stage to a data signal output stage being divided into a plurality of groups, each including predetermined stages of the data signal input/output circuits, wherein the clock supply circuit comprises a plurality of stages of buffers connected in series, the clock supply circuit supplying a clock signal, which is one of a plurality of clock signals derived from any one of the plurality of stages of buffers on the basis of an input clock signal and which is derived via a more number of stages of buffers, to a data signal input/output circuit belonging to a group nearer the data signal input stage of the plurality of stages of data signal input/output circuits out of the plurality of groups.

With this construction, the phase of the clock signal inputted to the transmit side data signal input/output circuit does not pass the phase of the clock signal inputted to the receive side data signal input/output circuit, so that each of the data signal input/output circuits can always acquire the ascertained data signal. As a result, it is possible to prevent the malfunction of the circuit due to clock skews. In addition, the clock supply circuit according to the first aspect of the present invention can achieve the above described function with simple construction and can be easily designed, so that the clock supply circuit can be applied to the design of various integrated circuits.

According to a second aspect of the present invention, there is provided a clock supply circuit for supplying clock signals to each of a plurality of stages of data signal input/output circuits and an output control signal generating circuit of a data transfer circuit, which comprises: the plurality of stages of data signal input/output circuits divided into a plurality of groups, each including predetermined stages of the data signal input/output circuits; a data bus serving as a transfer path for a data signal outputted from one of the data signal input/output circuits belonging to any one of the groups; the output control signal generating circuit, provided in each of the groups, for generating an output control signal for controlling the data signal outputted from the one of the data signal input/output circuits to the data bus for each of the groups; and a data signal selecting circuit for selecting any one of a data signal on the data bus and the data signal outputted from the one of the data signal input/output circuits, as a data signal to be inputted to the one of the data signal input/output circuits, wherein the clock supply circuit supplies a clock signal, which is phase-lagged from a clock signal supplied to each of the data signal input/output circuits, to the output control signal generating circuit.

Specifically, according to the second aspect of the present invention, there is provided a clock supply circuit for supplying clock signals to each of a plurality of stages of data signal input/output circuits and an output control signal generating circuit of a data transfer circuit, which comprises: the plurality of stages of data signal input/output circuits divided into a plurality of groups, each including predetermined stages of the data signal input/output circuits; a data bus serving as a transfer path for a data signal outputted from one of the data signal input/output circuits belonging to any one of the groups; the output control signal generating circuit, provided in each of the groups, for generating an output control signal for controlling the data signal outputted from the one of the data signal input/output circuits to the data bus for each of the groups; and a data signal selecting circuit for selecting any one of a data signal on the data bus and the data signal outputted from the one of the data signal input/output circuits, as a data signal to be inputted to the one of the data signal input/output circuits, wherein the clock supply circuit comprises a plurality of stages of buffers connected in series, the clock supply circuit supplying a clock signal, which is one of a plurality of clock signals derived from any one of the plurality of stages of buffers on the basis of an input clock signal and which is derived via the most number of stages of buffers, to the output control signal generating circuit.

With this construction, the phase of the clock signal inputted to the output control signal generating circuit for outputting the output control signal for controlling the output of the data signal to the data bus is always lagged from the phase of the clock signal inputted to each of the data signal input/output circuits for mutually transferring the data signal. Therefore, each of the data signal input/output circuits for mutually transferring the data signal can acquire a predetermined data signal before the data signal on the data bus varies, so that it is possible to completely prevent the malfunction of the circuit due to clock skews. In addition, the clock supply circuit according to the second aspect of the present invention can achieve the above described function with simple construction and can be easily designed, so that the clock supply circuit can be applied to the design of various integrated circuits.

In the clock supply circuit according to the first or second aspect of the present invention, the following construction may be applied.

The phase difference between the most phase-advanced clock signal and the most phase-lagged clock signal, out of the plurality of clock signals, each of which is supplied so as to have a phase difference from each other, on the basis of the input clock signal may be less than one period of the input clock signal. Thus, each stage of data signal input/output circuit can acquire a predetermined data signal at each timing.

In addition, the clock signal supply wiring for supplying the clock signals to the plurality of stages of data signal input/output circuit may be provided so as to pass through the plurality of stages of data signal input/output circuits. Thus, it is possible to prevent clock skews from being caused by the difference in wiring length from the clock buffers to the data signal input/output circuits or the like, so that it is possible to completely prevent the malfunction of the circuit due to clock skews. Moreover, part or all of the plurality of stages of buffers may be provided in the plurality of stages of data signal input/output circuits.

According to a third aspect of the present invention, a data transfer circuit comprises: a plurality of stages of cascade-connected data signal input/output circuits, the plurality of stages of data signal input/output circuits from a data signal input stage to a data signal output stage being divided into a plurality of groups, each including predetermined stages of the data signal input/output circuits; and a clock supply circuit for supplying a more phase-lagged clock signal to a data signal input/output circuit belonging to a group nearer the data signal input stage of the plurality of stages of data signal input/output circuits out of the plurality of groups.

Specifically, according to the third aspect of the present invention, the data transfer circuit comprises: a plurality of stages of cascade-connected data signal input/output circuits, the plurality of stages of data signal input/output circuits from a data signal input stage to a data signal output stage being divided into a plurality of groups, each including predetermined stages of the data signal input/output circuits; and a clock supply circuit comprising a plurality of stages of buffers connected in series, the clock supply circuit supplying a clock signal, which is one of a plurality of clock signals derived from any one of the plurality of stages of buffers on the basis of an input clock signal and which is derived via a more number of stages of buffers, to a data signal input/output circuit belonging to a group nearer the data signal input stage of the plurality of stages of data signal input/output circuit out of the plurality of groups.

With this construction, the phase of the clock signal inputted to the transmit side data signal input/output circuit does not pass the phase of the clock signal inputted to the receive side data signal input/output circuit, so that each of the data signal input/output circuits can always acquire the ascertained data signal. As a result, it is possible to prevent the malfunction of the circuit due to clock skews. In addition, the clock supply circuit of the data transfer circuit according to the third aspect of the present invention can achieve the above described function with simple construction and can be easily designed, so that the clock supply circuit can be applied to the design of various integrated circuits.

According to a fourth aspect of the present invention, a data transfer circuit comprises: a plurality of stages of data signal input/output circuits divided into a plurality of groups, each including predetermined stages of the data signal input/output circuits; a data bus serving as a transfer path for a data signal outputted from one of the data signal input/output circuits belonging to any one of the groups; an output control signal generating circuit, provided in each of the groups, for generating an output control signal for controlling the data signal outputted from the one of the data signal input/output circuits to the data bus for each of the groups; a data signal selecting circuit for selecting any one of a data signal on the data bus and the data signal outputted from the one of the data signal input/output circuits, as a data signal to be inputted to the one of the data signal input/output circuits; and a clock supply circuit a clock signal, which is phase-lagged from a clock signal supplied to each of the data signal input/output circuits, to the output control signal generating circuit.

Specifically, according to the fourth aspect of the present invention, the data transfer circuit comprises: a plurality of stages of data signal input/output circuits divided into a plurality of groups, each including predetermined stages of the data signal input/output circuits; a data bus serving as a transfer path for a data signal outputted from one of the data signal input/output circuits belonging to any one of the groups; an output control signal generating circuit, provided in each of the groups, for generating an output control signal for controlling the data signal outputted from the one of the data signal input/output circuits to the data bus for each of the groups; a data signal selecting circuit for selecting any one of a data signal on the data bus and the data signal outputted from the one of the data signal input/output circuits, as a data signal to be inputted to the one of the data signal input/output circuits; and a clock supply circuit comprising a plurality of stages of buffers connected in series, the clock supply circuit supplying a clock signal, which is one of a plurality of clock signals derived from any one of the plurality of stages of buffers on the basis of an input clock signal and which is derived via the most number of stages of buffers, to the output control signal generating circuit.

With this construction, the phase of the clock signal inputted to the output control signal generating circuit for outputting the output control signal for controlling the output of the data signal to the data bus is always lagged from the phase of the clock signal inputted to each of the data signal input/output circuits for mutually transferring the data signal. Therefore, each of the data signal input/output circuits for mutually transferring the data signal can acquire a predetermined data signal before the data signal on the data bus varies, so that it is possible to completely prevent the malfunction of the circuit due to clock skews. In addition, the clock supply circuit of the data transfer circuit according to the fourth aspect of the present invention can achieve the above described function with simple construction and can be easily designed, so that the clock supply circuit can be applied to the design of various integrated circuits.

In the data transfer circuit according to the third or fourth aspect of the present invention, the following construction may be applied.

The phase difference between the most phase-advanced clock signal and the most phase-lagged clock signal, out of the plurality of clock signals, each of which is supplied so as to have a phase difference from each other, on the basis of the input clock signal may be less than one period of the input clock signal. Thus, each stage of data signal input/output circuit can acquire a predetermined data signal at each timing.

In the clock supply circuit, the clock signal supply wiring for supplying the clock signals to the plurality of stages of data signal input/output circuit may be provided so as to pass through the plurality of stages of data signal input/output circuits. Thus, it is possible to prevent clock skews from being caused by the difference in wiring length from the clock buffers to the data signal input/output circuits or the like, so that it is possible to completely prevent the malfunction of the circuit due to clock skews. Moreover, part or all of the plurality of stages of buffers may be provided in the plurality of stages of data signal input/output circuits.

DESCRIPTION OF THE PREFERRED EMBODIMENTS

Referring now to the accompanying drawings, the preferred embodiments of a clock supply circuit and a data transfer circuit according to the present invention will be described below.

Figure 1:
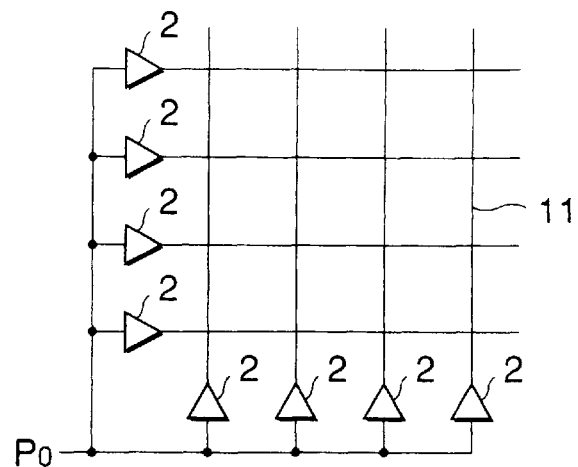
FIG. 1 is a schematic diagram for explaining conventional first clock skew eliminating means.
Figure 2:
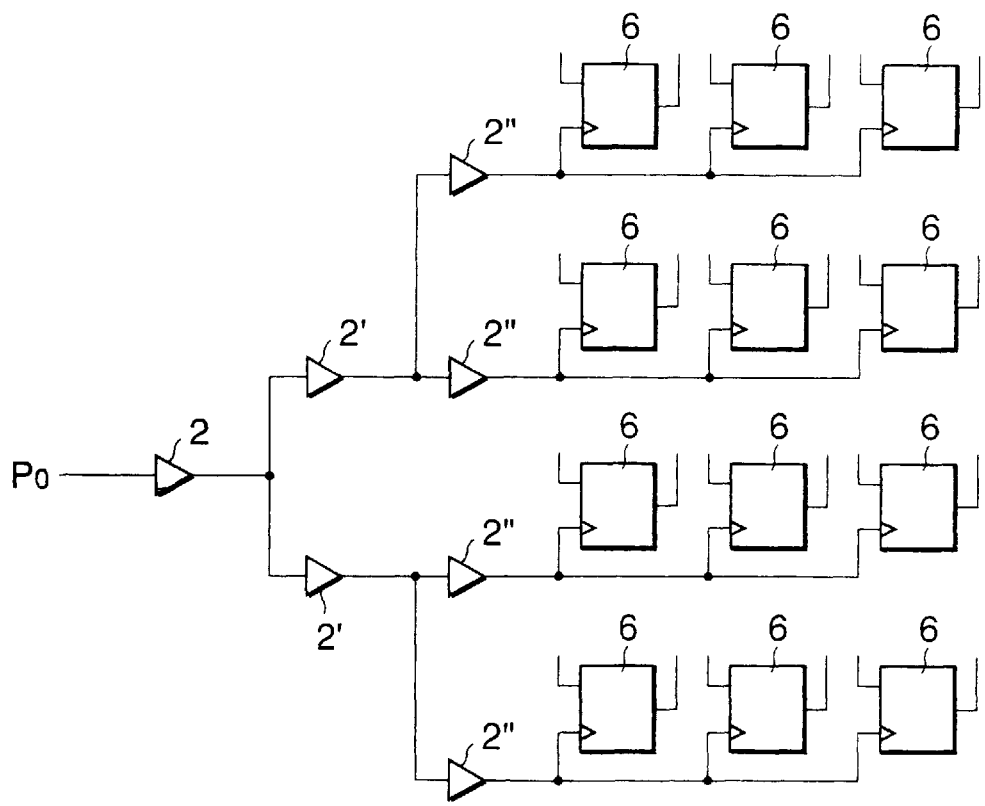
FIG. 2 is a schematic diagram for explaining conventional second clock skew eliminating means.
Figure 3:
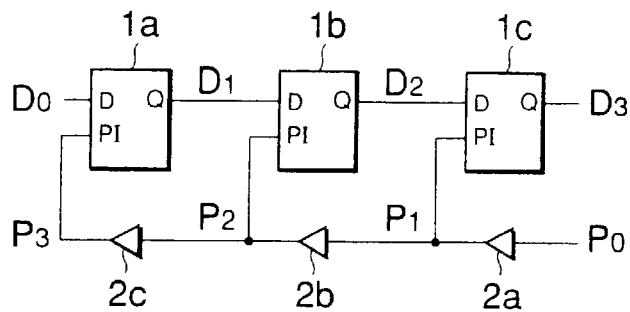
FIG. 3 is a block diagram of the first preferred embodiment of a data transfer circuit according to the present invention.

FIG. 3 is a block diagram of the first preferred embodiment of a data transfer circuit according to the present invention. In the first preferred embodiment, the data transfer circuit comprises a plurality of stages of flip-flops serving as data transfer paths, and a clock supply circuit for supplying clock signals to the flip-flops. Furthermore, while the number of stages of flip-flops forming the data transfer circuit is 3 in this preferred embodiment, the present invention should not be limited thereto, but it may be an optional plural number of stages.

In the first preferred embodiment, the data transfer circuit comprises a first stage of flip-flop 1a for inputting an input data signal D0 to output a data signal D1, a second stage of flip-flop 1b for inputting the data signal D1 from the first stage of flip-flop 1a to output a data signal D2, and a third stage of ffip-flop 1c for inputting the data signal D2 from the second stage of flip-flop 1b to output a data signal D3. First, second and third clock signals P1, P2 and P3 are inputted to the third, second and first stages of flip-flops 1c, 1b and 1a, respectively.

The clock supply circuit for supplying the first, second and third clock signals P1, P2 and P3 comprises first, second and third stages of clock buffers 2a, 2b and 2c which are sequentially connected in series. An input clock signal P0 is inputted to the first stage of clock buffer 2a. The first, second and third clock signals P1, P2 and P3 are output signals of the first, second and third clock buffers 2a, 2b and 2c, respectively. That is, the clock signals are inputted to the respective flip-flops forming the data transfer circuit in the first preferred embodiment so that the clock signal on the upstream side of the data signal path has a relative phase lag and the clock signal on the downstream side of the data signal path has a relative phase advance.

For example, in the arrangement and wiring based on the manual operation, the phase difference in the clock signal can be achieved by a parasitic delay circuit comprising a wiring resistance and a wiring capacity. However, an automatic arrangement wiring is adopted, it is generally difficult and nearly impossible to assign the arrangement order of flip-flops connected a clock distributing line. According to the first preferred embodiment, the arrangement order of flip-flops is assigned relatively to the respective clock buffers, so that the phase difference in the clock signal can be achieved by the automatic arrangement wiring, and yet there is some possibility that the above described relative phase difference can not held in accordance with the wiring downstream of the clock buffer. However, if the second preferred embodiment, which will be described later, is adopted, it is possible to completely solve the problem that the relative phase difference can not be held, regardless of the state of the wiring downstream of the clock buffer.

Figure 4:
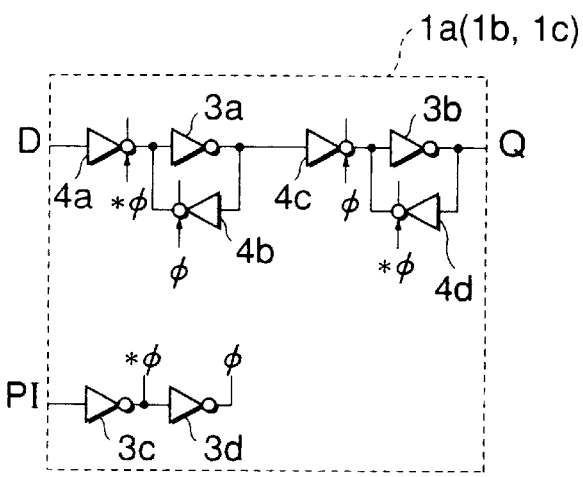
FIG. 4 is a block diagram of an embodiment of a flip-flop for use in the first preferred embodiment of a data transfer circuit according to the present invention.

FIG. 4 is a block diagram of an embodiment of a flip-flop for use in the first preferred embodiment of a data transfer circuit according to the present invention. In FIG. 4, the flip-flop is a master slave type D flip-flop wherein two stages of latch circuits are connected in series. That is, the flip-flop shown in FIG. 4 comprises: a first clocked inverter 4a and a first inverter 3a, which are sequentially connected in series to a data input node D; a second clocked inverter 4b connected to the first inverter 3a for feedback; a third clocked inverter 4c and a second inverter 3b, which are sequentially connected in series to the first inverter 3a; a fourth clocked inverter 4d connected to the second inverter 3b for feedback; and third and fourth inverters 3c and 3d which are sequentially connected in series to a clock input node PI. Clock signals * φ (the sign "*" means a logical inversion, which will be hereinafter the same), which are output signals of the third inverter 3c, are inputted to the first and fourth clocked inverters 4a and 4d, and clock signals φ, which are output signals of the fourth inverter 3d, are inputted to the second and third clocked inverters 4b and 4c.

At a timing that the master side latch circuit (4a, 3a, 4b) acquires input data signals, the slave side latch circuit (4c, 3b, 4d) holds and outputs data signals in the last cycle. At the same time that the data acquisition port of the master side latch circuit is closed, the data acquisition port of the slave side latch circuit is open to acquire the data signals from the master side latch circuit to update the output data signals.

Figure 5:
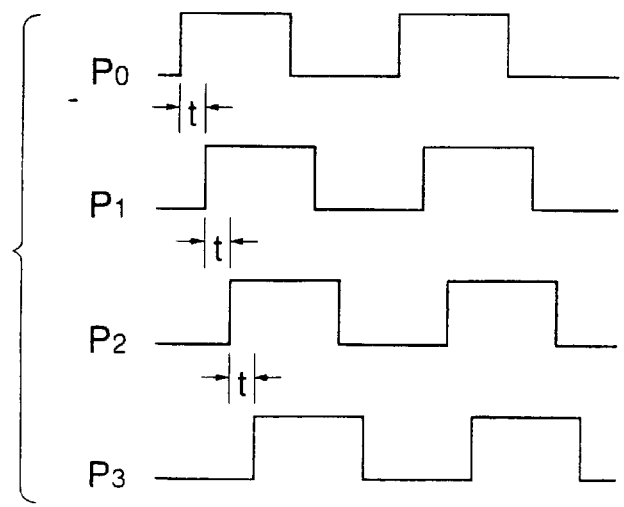
FIG. 5 is a timing chart of clock signals in the first preferred embodiment of a data transfer circuit according to the present invention.

FIG. 5 is a timing chart of clock signals in the first preferred embodiment of a data transfer circuit according to the present invention. The first, second and third clock signals P1, P2 and P3 are output signals of the first, second and third stages of clock buffers, to which the input clock signal P0 has been inputted. Therefore, assuming that a signal propagation delay time per one stage of clock buffer is t, the phases of the first, second third clock signals P1, P2 and P3 are lagged -from the input clock signal P0 by t, 2t and 3t, respectively. Furthermore, it is assumed that there is no delay in the wiring.

In the first preferred embodiment of a data transfer circuit according to the present invention, which is shown in FIG. 3, the data signal is propagated from the first stage of flip-flop 1a to the second stage of flip-flop 1b and from the second stage of flip-flop 1b to the third stage of flip-flop 1c. On the other hand, the clock signal is propagated in a reverse direction of the data signal from the third stage of flip-flop 1c to the first flip-flop 1a via the second flip-flop 1b, so that the arriving times of the clock signal at the respective stages of flip-flops have phase differences every the signal propagation delay time t corresponding to one stage of clock buffer. Therefore, since the phase of the clock signal inputted to the transmit side flip-flop does not pass the phase of the clock signal inputted to the receive side flip-flop, each of the flip-flops can always acquire the ascertained data signal. As a result, it is possible to prevent the malfunction of the circuit from being caused by clock skews. In addition, the clock supply circuit in the first preferred embodiment of a data transfer circuit according to the present invention can achieve the above described function with simple construction and can be easily designed, so that the clock supply circuit can be applied to the design of various integrated circuits.

However, in order to cause each stage of flip-flop to acquire a predetermined data signal at each timing, it is a necessary condition that the total of the clock signal propagation delay times t in the respective stages of flip-flops is less than one period of the clock signal. That is, assuming that the number of stages of flip-flops is n and the period of the clock signal is T, the condition nt<T must be met. Therefore, assuming that the frequency of the clock signal is f, the upper limit of the frequency f of the clock signal is limited to the condition f<1/nt.

Figure 6:
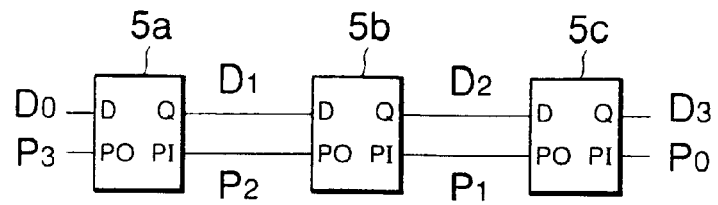
FIG. 6 is a block diagram of the second preferred embodiment of a data transfer circuit according to the present invention.

FIG. 6 is a block diagram of the second preferred embodiment of a data transfer circuit according to the present invention. In the second preferred embodiment, the data transfer circuit has a clock supply circuit for supplying clock signals, the clock supply circuit being built in the cells of a plurality of stages of flip-flops serving as data transfer paths. Furthermore, while the number of stages of flip-flops forming the data transfer circuit is 3 in this preferred embodiment, the present invention should not be limited thereto, but it may be an optional plural number of stages.

In the second preferred embodiment, the data transfer circuit comprises a first stage of flip-flop 5a for inputting an input data signal D0 to output a data signal D1, a second stage of flip-flop 5b for inputting the data signal D1 from the first stage of flip-flop 5a to output a data signal D2, and a third stage of flip-flop 5c for inputting the data signal D2 from the second stage of flip-flop 5b to output a data signal D3. The third stage of flip-flop 5c outputs a first clock signal P1 in accordance with the input of a clock signal P0, the second stage of flip-flop 5b outputs a second clock signal P2 in accordance with the input of the first clock signal P1, and the first stage of flip-flop 5a outputs a third clock signal P3 in accordance with the input of the second clock signal P2.

Figure 7:
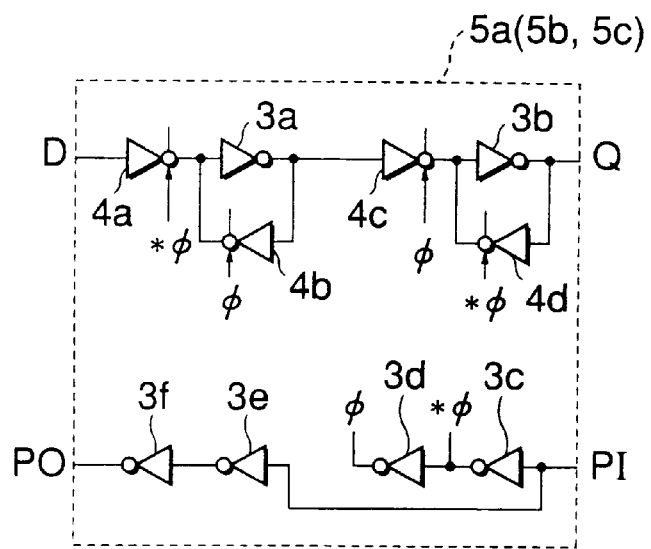
FIG. 7 is a block diagram of a first embodiment of a flip-flop for use in the second preferred embodiment of a data transfer circuit according to the present invention.

FIG. 7 is a block diagram of a first embodiment of a flip-flop for use in the second preferred embodiment of a data transfer circuit according to the present invention. In FIG. 7, the flip-flop is a master slave type D flip-flop wherein two stages of latch circuits are connected in series. The construction of part serving as a data transfer path is the same as that of the flip-flop shown in FIG. 4. That is, the flip-flop shown in FIG. 7 comprises: a first clocked inverter 4a and a first inverter 3a, which are sequentially connected in series to a data input node D; a second clocked inverter 4b connected to the first inverter 3a for feedback; a fourth clocked inverter 4d and a second inverter 3b, which are sequentially connected in series to the first inverter 3a; and a fourth clocked inverter 4d connected to the second inverter 3b for feedback.

Moreover, each of the built-in clock supply circuits for supplying clock signals to the respective latch circuits also serves as a clock supply circuit for the upstream stage of flip-flop. This clock supply circuit comprises: third and fourth inverters 3c and 3d which are sequentially connected in series to a clock input node PI; and fifth and sixth inverters 3e and 3f which are sequentially connected in series between the clock input node PI and a clock output node PO. Clock signals * φ, which are output signals of the third inverter 3c, are inputted to the first and third clocked inverters 4a and 4c, and clock signals φ, which are output signals of the fourth inverter 3d, are inputted to the second and third clocked inverters 4b and 4c. The clock signals inputted to the clock input node PI of the flip-flop are outputted from the clock output node PO via the fifth and sixth inverters 3e and 3f to be inputted to the clock input node of the upstream stage of flip-flop.

Figure 8:
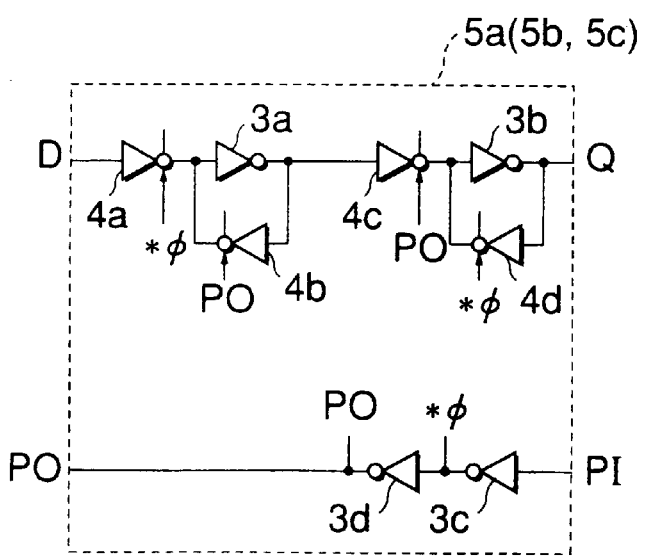
FIG. 8 is a block diagram of a second embodiment of a flip-flop for use in the second preferred embodiment of a data transfer circuit according to the present invention.

FIG. 8 is a block diagram of a second embodiment of a flip-flop for use in the second preferred embodiment of a data transfer circuit according to the present invention. The flip-flop shown in FIG. 8 is a master slave type D flip-flop wherein two stages of latch circuits are connected in series. Although the construction of part serving as a data transfer path is substantially the same as that of the flip-flop shown in FIG. 7, the construction of a clock supply circuit built in the flip-flop is different from that shown in FIG. 7. The built-in clock supply circuit for supplying clock signals to the respective latch circuits also serves as a clock supply circuit to the upstream stage of flip-flop. This point is the same as that of the flip-flop shown in FIG. 7. However, this clock supply circuit comprises third and fourth inverters 3c and 3d which are sequentially connected in series between a clock input node PI and a clock output node PO. Clock signals * φ, which are output signals of the third inverter 3c, are inputted to the first and fourth clocked inverters 4a and 4d, and clock signals PO, which are output signals of the fourth inverter 3d, are inputted to the second and third clocked inverters 4b and 4c to be outputted from the clock output node PO to be inputted to the clock input node of the upstream stage of flip-flop.

In the first preferred embodiment of a data transfer circuit according to the present invention, which is shown in FIG. 3, although it is considered that there is practically little possibility that the malfunction of the circuit is caused by clock skews due to the difference in wiring length from the clock buffer to the flip-flop, there is physically some possibility. On the other hand, since the flip-flop shown in FIG. 7 or 8 is used in the second preferred embodiment of a data transfer circuit according to the present invention, which is shown in FIG. 6, clock skews are not produced due to the difference in wiring length from the clock buffer to the flip-flop, so that it is possible to completely prevent the malfunction of the circuit from being caused by clock skews. In addition, the clock supply circuit in the second preferred embodiment of a data transfer circuit according to the present invention can achieve the above described function with simple construction and can be easily designed, so that the clock supply circuit can be applied to the design of various integrated circuits.

However, for the same reason as that in the first preferred embodiment, it is a necessary condition that the total of the clock signal propagation delay times t in the respective stages of flip-flops is less than one period of the clock signal. That is, assuming that the number of stages of flip-flops is n and the period of the clock signal is T, the condition nt<T must be met. Therefore, assuming that the frequency of the clock signal is f, the upper limit of the frequency f of the clock signal is limited to the condition f<1/nt. When the semiconductor producing technique at the filing of the present application is used, the clock signal propagation delay time t may be about 100 ps. In this case, assuming that the number n of stages of flip-flops is 100, the upper limit of the frequency f of the clock signal is 100 MHz. In practice, it is considered that the operation limit is about 50 MHz due to delay in the wiring.

Figure 9:
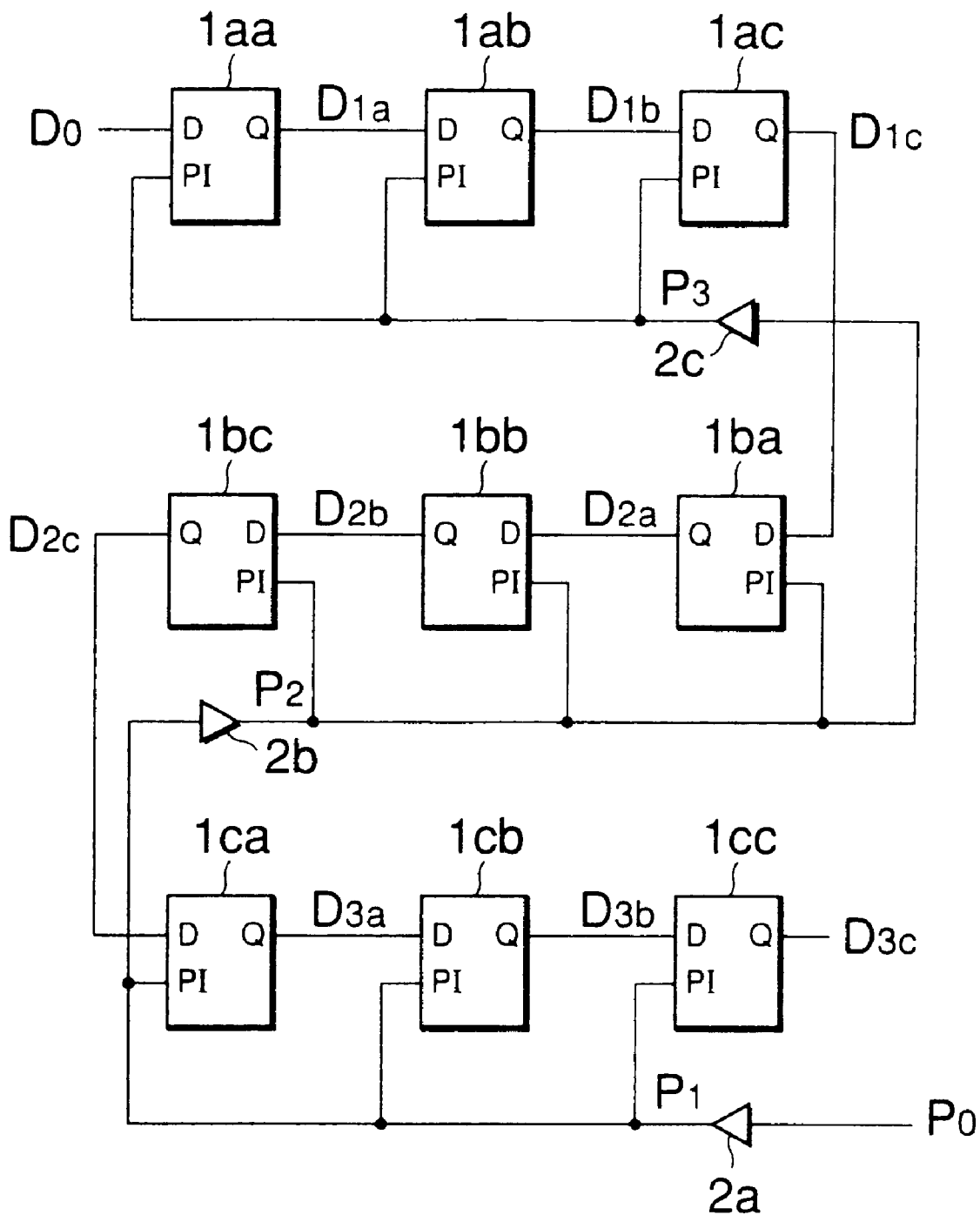
FIG. 9 is a block diagram of the third preferred embodiment of a data transfer circuit according to the present invention.

FIG. 9 is a block diagram of the third preferred embodiment of a data transfer circuit according to the present invention. The data transfer circuit in the third preferred embodiment is a modified example of the first preferred embodiment of a data transfer circuit according to the present invention, which is shown in FIG. 3. In the first preferred embodiment of a data transfer circuit according to the present invention, clock signals having a signal propagation delay time increased by t every one stage of flip-flop has been used for each stage of flip-flop using the clock supply circuit having one stage of clock buffer added every one stage of flip-flop. On the other hand, in the third preferred embodiment of a data transfer circuit according to the present invention, a clock signal having a signal propagation delay time increased by t every three stages of flip-flops has been used for each stage of flip-flop using a clock supply circuit which has one stage of clock buffer added every three stages of flip-flops. Furthermore, while the clock supply circuit has one stage of clock buffer added every three stages of flip-flops, a clock supply circuit having one stage of clock buffer added every an optional plurality of stages of flip-flops may be used.

The data transfer circuit in the third preferred embodiment comprises: a first stage of flip-flop 1aa for inputting an input data signal D0 to output a data signal D1a; a second stage of flip-flop 1ab for inputting the data signal D1a to output a data signal D1b; a third stage of flip-flop 1ac for inputting the data signal D1b to output a data signal D1c; a fourth stage of flip-flop 1ba for inputting the data signal D1c to output a data signal D2a; a fifth stage of flip-flop 1bb for inputting the data signal D2a to output a data signal D2b; a sixth stage of flip-flop 1bc for inputting the data signal D2b to output a data signal D2c; a seventh stage of flip-flop 1ca for inputting the data signal D2c to output a data signal D3a; an eighth stage of flip-flop 1cb for inputting the data signal D3a to output a data signal D3b; and a ninth stage of flip-flop 1cc for inputting the data signal D3b to output a data signal D3c. A first clock signal P1 is inputted to each of the seventh, eighth and ninth stages of flip-flops 1ca, 1cb and 1cc. A second clock signal P2 is inputted to each of the fourth, fifth and sixth stages of flip-flops 1ba, 1bb and 1bc. A third clock signal P3 is inputted to each of the first, second and third stages of flip-flops 1aa, 1ab and 1ac.

The clock supply circuit for supplying the first, second and third clock signals P1, P2 and P3 comprises first, second and third stages of clock buffers 2a, 2b and 2c. The input clock signal P0 is inputted to the first stage of clock buffer 2a. The first, second and third clock signals P1, P2 and P3 are output signals of the first, second and third stage of clock buffers 2a, 2b and 2c, respectively. That is, a relatively phase-lagged clock signal on the upstream side of the data signal path and a relatively phase-advanced clock signal on the downstream side of the data signal path are inputted to each of the flip-flops forming the third preferred embodiment of a data transfer circuit according to the present invention, every three stages of flip-flops.

Similar to the first preferred embodiment, each of the flip-flops forming the third preferred embodiment of a data transfer circuit according to the present invention may be a flip-flop shown in, e.g., FIG. 4.

In the third preferred embodiment of a data transfer circuit according to the present invention, the data signal is propagated from the first stage of flip-flop 1aa to the second stage of flip-flop 1ab, from the second stage of flip-flop 1ab to the third stage of flip-flop 1ac, and similarly, from the eighth stage of flip-flop 1cb to the ninth stage of flip-flop 1cc. On the other hand, the clock signal is propagated in a reverse direction of the data signal in the order of the seventh, eighth and ninth stages of flip-flops 1ea, 1cb and 1cc, the fourth, fifth and sixth stages of flip-flops 1ba, 1bb and 1bc, and the first, second and third stages of flip-flops 1aa, 1ab and 1ac. The arriving time of the clock signal at each stage of flip-flop has a phase difference by the signal propagation delay time t for one stage of clock buffer every three stages of flip-flops. Therefore, with respect to each three stages of flip-flops, the phase of the clock signal inputted to a flip-flop on the upstream side of the data signal path does not pass the phase of the clock signal inputted to a flip-flop on the downstream side of the data signal path, so that each of the flip-flops can always acquire the ascertained data signal. As a result, it is possible to prevent the malfunction of the circuit from being caused by clock skews. In addition, the clock supply circuit in the third preferred embodiment of a data transfer circuit according to the present invention can achieve the above described function with simple construction and can be easily designed, so that the clock supply circuit can be applied to the design of various integrated circuits.

Furthermore, with respect to the three stages of flip-flops for inputting clock signals having the same phase, it is considered that there is practically little possibility that a large clock skew for causing the malfunction of the circuit although there is physically some possibility that the malfunction of the circuit is caused by clock skews due to the difference in wiring length from the clock buffer to the flip-flop. In particular, in the circuit construction shown in FIG. 9, if the circuit is designed so that the flip-flop on the upstream side of the data signal path out of the three stages of flip-flops for inputting clock signals having the same phase has a larger wiring length, a slightly phase-lagged clock signal is inputted to the upstream side of the three stages of flip-flops, to which clock signals having the same phase are inputted, so that it is possible to prevent the production of clock skews which cause the malfunction of the circuit.

However, in order to cause each stage of flip-flop to acquire a predetermined data signal at each timing, it is a necessary condition that the total of the clock signal propagation delay times t in the respective stages of flip-flops is less than one period of the clock signal. That is, assuming that the number of stages of flip-flops is n and the period of the clock signal is T, and assuming that one stage of clock buffer of the clock supply circuit is added every m stages of flip-flops, the condition nt/m<T must be met. Therefore, assuming that the frequency of the clock signal is f, the upper limit of the frequency f of the clock signal is limited to the condition f<m/nt, so that the upper limit of the frequency f of the clock signal can be increased to be m times as large as the case where one clock buffer of the clock supply circuit is added every one stage of flip-flop.

Figure 10:
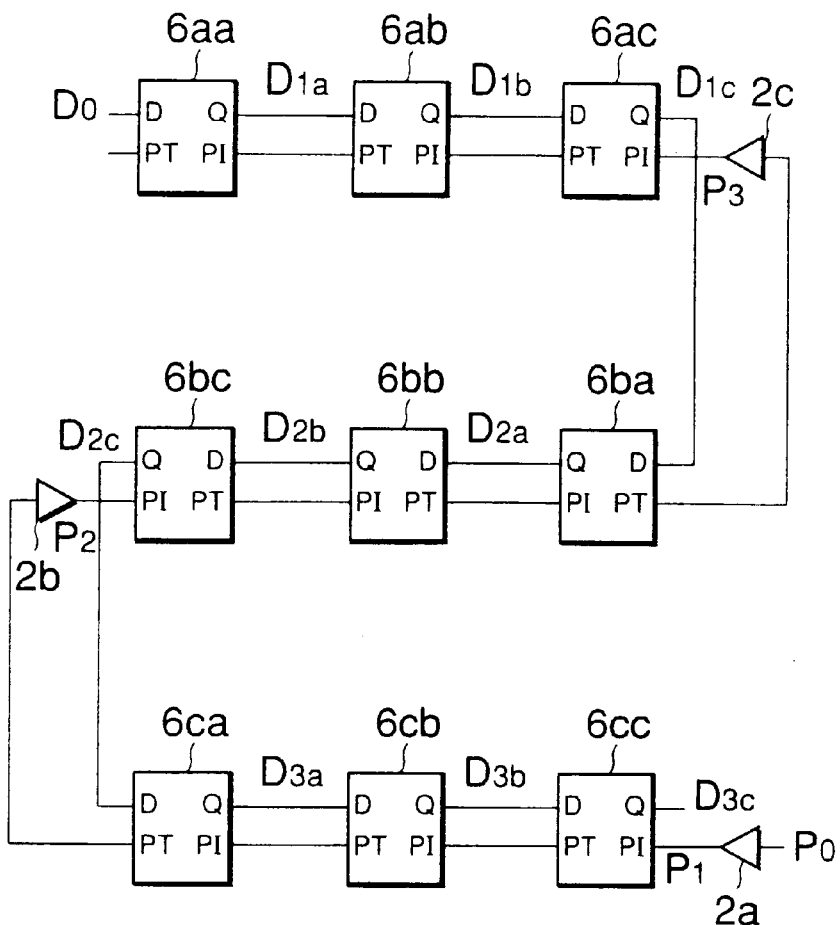
FIG. 10 is a block diagram of the fourth preferred embodiment of a data transfer circuit according to the present invention.

FIG. 10 is a block diagram of the fourth preferred embodiment of a data transfer circuit according to the present invention. In the data transfer circuit in the fourth preferred embodiment, a clock signal supply wiring of a clock supply circuit for supplying clock signals is built in each of the cells of a plurality of stages of flip-flops serving as a data transfer path. One stage of clock buffer is inserted into and connected to the clock signal supply path of the clock supply circuit every three stages of flip-flops. Clock signals having signal propagation delay times increased by t every three stages of flip-flops are used for the respective stages of flip-flops. Furthermore, while one stage of clock buffer is inserted into and connected to the block signal supply path of the clock supply circuit every three stages of flip-flops in this preferred embodiment, one stage of clock buffer may be inserted into and connected to the block signal supply path of the clock supply circuit every optional plural stages of flip-flops.

The data transfer circuit in the fourth preferred embodiment comprises: a first stage of flip-flop 6aa for inputting an input data signal D0 to output a data signal D1a; a second stage of flip-flop 6ab for inputting the data signal D1a to output a data signal D1b; a third stage of flip-flop 6ac for inputting the data signal D1b to output a data signal D1c; a fourth stage of flip-flop 6ba for inputting the data signal D1c to output a data signal D2a; a fifth stage of flip-flop 6bb for inputting the data signal D2a to output a data signal D2b; a sixth stage of flip-flop 6bc for inputting the data signal D2b to output a data signal D2c; a seventh stage of flip-flop 6ca for inputting the data signal D2c to output a data signal D3a; an eighth stage of flip-flop 6cb for inputting the data signal D3a to output a data signal D3b; and a ninth stage of flip-flop 6cc for inputting the data signal D3b to output a data signal D3c. A first clock signal P1 is inputted to each of the seventh, eighth and ninth stages of flip-flops 6ca, 6cb and 6cc. A second clock signal P2 is inputted to each of the fourth, fifth and sixth stages of flip-flops 6ba, 6bb and 6bc. A third clock signal P3 is inputted to each of the first, second and third stages of flip-flops 6aa, 6ab and 6ac.

The clock supply circuit for supplying the first, second and third clock signals P1, P2 and P3 comprises: a clock signal supply wiring passing through the respective flip-flops from the downstream of the data signal path to the upstream thereof; a first stage of clock buffer 2a, connected to the upstream side of a clock input node of the ninth stage of flip-flop 6cc, for inputting the input clock signal P0; a second stage of clock buffer 2b provided between the seventh stage of flip-flop 6ca and the sixth stage of flip-flop 6bc; and a third stage of clock buffer 2c provided between the fourth stage of flip-flop 6ba and the third stage of flip-flop 6ac. The first, second and third clock signals P1, P2 and P3 are output signals of the first, second and third stage of clock buffers 2a, 2b and 2c, respectively. That is, similar to the third preferred embodiment, a relatively phase-lagged clock signal on the upstream side of the data signal path and a relatively phase-advanced clock signal on the downstream side of the data signal path are inputted to each of the flip-flops forming the third preferred embodiment of a data transfer circuit according to the present invention, every three stages of flip-flops. However, the fourth preferred embodiment is different from that third preferred embodiment at the point that the clock supply wiring passes through the flip-flops.

Figure 11:
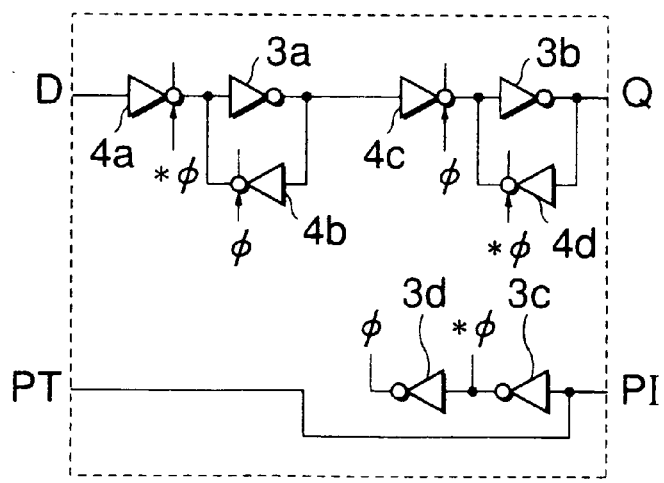
FIG. 11 is a block diagram of an embodiment of a flip-flop for use in the fourth preferred embodiment of a data transfer circuit according to the present invention.

FIG. 11 is a block diagram of an embodiment of a flip-flop for use in the fourth preferred embodiment of a data transfer circuit according to the present invention. The flip-flop shown in FIG. 11 is a master slave type D flip-flop wherein two stages of latch circuits are connected in series. The construction of the part serving as the data transfer path is the same as that of the flip-flop shown in FIG. 4. That is, the flip-flop shown in FIG. 11 comprises: a first clocked inverter 4a and a first inverter 3a, which are sequentially connected in series to a data input node D; a second clocked inverter 4b connected to the first inverter 3a for feedback; a third clocked inverter 4c and a second inverter 3b, which are sequentially connected in series to the first inverter 3a; and a fourth clocked inverter 4d connected to the second inverter 3b for feedback.

Moreover, each of the built-in clock supply circuits for supplying clock signals to the respective latch circuits also serves as a clock supply circuit for the upstream stage of flip-flop. This clock supply circuit comprises: third and fourth inverters 3c and 3d which are sequentially connected in series to a clock input node PI; and a clock through path for connecting the clock input node PI to a clock passing node PT. Clock signals * φ, which are output signals of the third inverter 3c, are inputted to the first and fourth clocked inverters 4a and 4d, and clock signals φ, which are output signals of the fourth inverter 3d, are inputted to the second and third clocked inverters 4b and 4c. The clock signals inputted to the clock input node PI of the flip-flop are outputted directly from the clock passing node PT via the clock through path to be inputted to the clock input node of the upstream stage of flip-flop.

In the fourth preferred embodiment of a data transfer circuit according to the present invention, the data signal is propagated from the first stage of flip-flop 6aa to the second stage of flip-flop 6ab, from the second stage of flip-flop 6ab to the third stage of flip-flop 6ac, and similarly, from the eighth stage of flip-flop 6cb to the ninth stage of flip-flop 6cc. On the other hand, the clock signal is propagated in a reverse direction of the data signal from the ninth stage of flip-flop 6cc to the eighth stage of flip-flop 6cb, from the eighth stage of flip-flop 6cb to the seventh stage of flip-flop 6ca, and similarly, from the second stage of flip-flop 6ab to the first stage of flip-flop 6aa. The arriving time of the clock signal at each stage of flip-flop has a phase difference by the signal propagation delay time t for one stage of clock buffer every three stages of flip-flops. Therefore, with respect to each three stages of flip-flops, the phase of the clock signal inputted to a flip-flop on the upstream side of the data signal path does not pass the phase of the clock signal inputted to a flip-flop on the downstream side of the data signal path, so that each of the flip-flops can always acquire the ascertained data signal. In addition, since the clock supply wiring is provided in each of the flip-flops, it is possible to completely remove clock skews which disturb the data signal acquiring timing due to the wiring extending from the clock buffer to the flip-flop. As a result, it is possible to completely prevent the malfunction of the circuit due to clock skews. In addition, the clock supply circuit in the fourth preferred embodiment of a data transfer circuit according to the present invention can achieve the above described function with simple construction and can be easily designed, so that the clock supply circuit can be applied to the design of various integrated circuits.

However, in order to cause each stage of flip-flop to acquire a predetermined data signal at each timing, it is a necessary condition that the total of the clock signal propagation delay times t in the respective stages of flip-flops is less than one period of the clock signal. That is, assuming that the number of stages of flip-flops is n and the period of the clock signal is T, and assuming that one stage of clock buffer of the clock supply circuit is added every m stages of flip-flops, the condition nt/m<T must be met. Therefore, assuming that the frequency of the clock signal is f, the upper limit of the frequency f of the clock signal is limited to the condition f<m/nt, so that the upper limit of the frequency f of the clock signal can be increased to be m times as large as the case where one clock buffer of the clock supply circuit is added every one stage of flip-flop.

Figure 12:
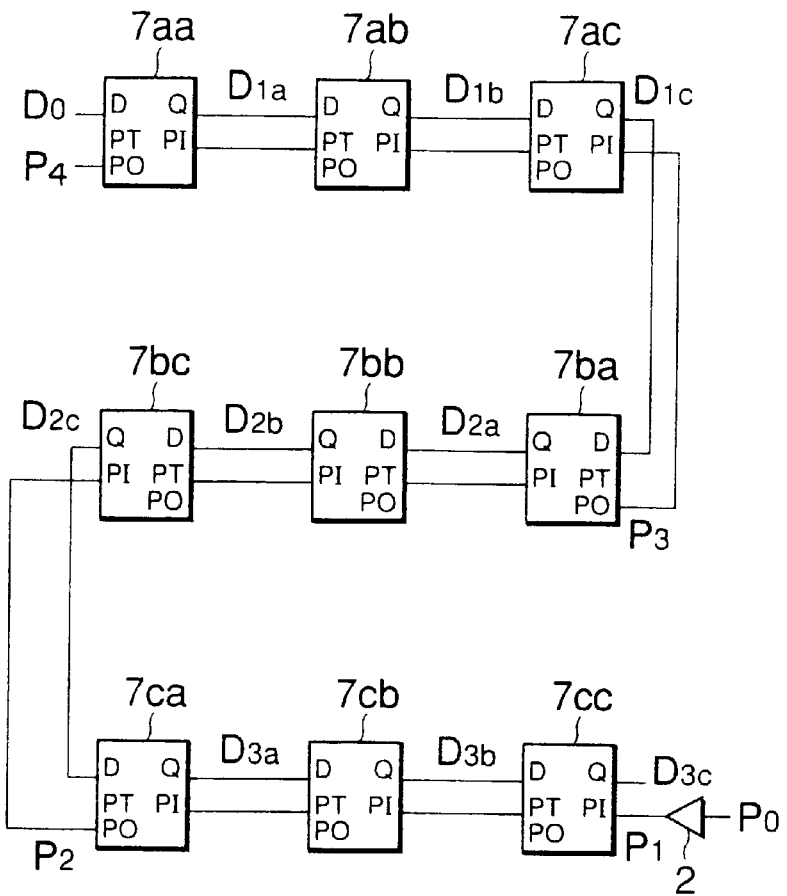
FIG. 12 is a block diagram of the fifth preferred embodiment of a data transfer circuit according to the present invention.

FIG. 12 is a block diagram of the fifth preferred embodiment of a data transfer circuit according to the present invention. In the data transfer circuit in the fifth preferred embodiment, the clock signal supply wirings and clock buffers of a clock supply circuit for supplying clock signals are built in the cells of a plurality of stages of flip-flops serving as data transfer paths, and the built-in clock buffers are used to delay the clock signals every three stages of flip-flops. While the clock buffers are used for each three stages of flip-flops in this preferred embodiment, the clock buffers may be used for an optional plurality of stages of flip-flops.

The data transfer circuit in the fifth preferred embodiment comprises: a first stage of flip-flop 7aa for inputting an input data signal D0 to output a data signal D1a; a second stage of flip-flop 7ab for inputting the data signal D1a to output a data signal D1b; a third stage of flip-flop 7ac for inputting the data signal D1b to output a data signal D1c; a fourth stage of flip-flop 7ba for inputting the data signal D1c to output a data signal D2a; a fifth stage of flip-flop 7bb for inputting the data signal D2a to output a data signal D2b; a sixth stage of flip-flop 7bc for inputting the data signal D2b to output a data signal D2c; a seventh stage of flip-flop 7ca for inputting the data signal D2c to output a data signal D3a; an eighth stage of flip-flop 7cb for inputting the data signal D3a to output a data signal D3b; and a ninth stage of flip-flop 7cc for inputting the data signal D3b to output a data signal D3c.

The clock supply paths of the clock supply circuits for supplying the first, second and third clock signals P1, P2 and P3 are provided so as to pass through the respective flip-flops from the downward to upward of the data signal path. Each of the clock signal supply paths of the clock supply circuits built in the respective flip-flops comprises: a clock through path for allowing the input clock signals to pass; and a clock delay path having a clock buffer for delaying the input clock signal by a predetermined signal propagation delay time t to output the resulting delayed clock signal. The clock delay path is used for each three stages of flip-flops, and the clock through path is used for each of other flip-flops, so that a clock signal having a signal propagation delay time increased by t every three stages of flip-flops is used for each stage of flip-flop.

The input clock signal P0 passes through the clock buffer 2 to be a first clock signal P1, and the first clock signal P1 is inputted to the ninth stage of flip-flop 7cc. The first clock signal P1 is used in the ninth stage of flip-flop 7cc and passes through the clock through path thereof to be inputted to the eighth stage of flip-flop 7cb. Then, the first clock signal P1 is used in the eighth stage of flip-flop 7cb and passes through the clock through path thereof to be inputted to the seventh flip-flop 7ca. In the seventh stage of flip-flop 7ca, the clock delay path having the clock buffer is used, and the input first clock signal P1 is outputted as a second clock signal P2 having a phase lag of a signal propagation delay time t.

Similarly, the second clock signal P2 is sequentially inputted to the sixth, fifth and fourth stages of flip-flops 7bc, 7bb and 7ba. In the fourth stage of flip-flop 7ba, the clock delay path having the clock buffer is used, and the inputted second clock signal P2 is outputted as a third clock signal P3 having a phase lag of a signal propagation delay time t. Moreover, the third clock signal P3 is sequentially inputted to the third, second and first stages of flip-flops 7ac, 7ab and 7aa. That is, similar to the fourth preferred embodiment, a relatively phase-lagged clock signal is inputted, on the upstream side of the data signal path, to each of the flip-flops forming the fifth preferred embodiment of a data transfer circuit according to the present invention, and a relatively phase-advanced clock signal is inputted, on the downstream side of the data signal path, to each of the flip-flops. However, the fifth preferred embodiment is different from the fourth preferred embodiment at the point that the clock supply wiring, as well as the clock buffer, is built in the cell of each of the flip-flops.

Figure 13:
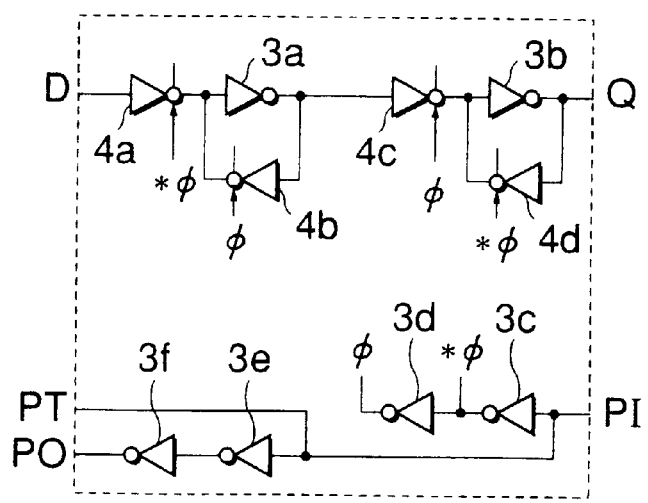
FIG. 13 is a block diagram of an embodiment of a flip-flop for use in the fifth preferred embodiment of a data transfer circuit according to the present invention.

FIG. 13 is a block diagram of an embodiment of a flip-flop for use in the fifth preferred embodiment of a data transfer circuit according to the present invention. The flip-flop shown in FIG. 13 is a master slave type D flip-flop wherein two stages of latch circuits are connected in series. The construction of the part serving as the data transfer path is the same as that of the flip-flop shown in FIG. 4. That is, the flip-flop shown in FIG. 13 comprises: a first clocked inverter 4a and a first inverter 3a, which are sequentially connected in series to a data input node D; a second clocked inverter 4b connected to the first inverter 3a for feedback; a third clocked inverter 4c and a second inverter 3b, which are sequentially connected in series to the first inverter 3a; and a fourth clocked inverter 4d connected to the second inverter 3b for feedback.

Moreover, each of the built-in clock supply circuits for supplying clock signals to the respective latch circuits also serves as a clock supply circuit for the upstream stage of flip-flop. This clock supply circuit comprises: third and fourth inverters 3c and 3d which are sequentially connected in series to a clock input node PI; and a clock through path of a wiring for connecting the clock input node PI to a clock passing node PT, and two stages of inverters 3e and 3f which are connected in series between the clock input node PI and a clock output node PO. Clock signal * φ, which are output signals of the third inverter 3c, are inputted to the first and fourth clocked inverters 4a and 4d, and clock signals φ, which are output signals of the fourth inverter 3d, are inputted to the second and third clocked inverters 4b and 4c. The clock signals inputted to the clock input node PI of the flip-flop are outputted directly from the clock passing node PT via the clock through path, or outputted from the clock output node PO via the clock delay path as clock signals, which are phase-lagged by a signal propagation delay time t. Any one of the outputted clock signals is inputted to the clock input node of the upstream stage of flip-flop.

In the fifth preferred embodiment of a data transfer circuit according to the present invention, which is shown in FIG. 13, the data signal is propagated from the first stage of flip-flop 7aa to the second stage of flip-flop 7ab, from the second stage of flip-flop 7ab to the third stage of flip-flop 7ac, and similarly, from the eighth stage of flip-flop 7cb to the ninth stage of flip-flop 7cc. On the other hand, the clock signal is propagated in a reverse direction of the data signal from the ninth stage of flip-flop 7cc to the eighth stage of flip-flop 7cb, from the eighth stage of flip-flop 7cb to the seventh stage of flip-flop 7ca, and similarly, from the second stage of flip-flop 7ab to the first stage of flip-flop 7aa. The arriving time of the clock signal at each stage of flip-flop has a phase difference by the signal propagation delay time t for one stage of clock buffer every three stages of flip-flops.

Therefore, with respect to each three stages of flip-flops, the phase of the clock signal inputted to a flip-flop on the upstream side of the data signal path does not pass the phase of the clock signal inputted to a flip-flop on the downstream side of the data signal path, so that each of the flip-flops can always acquire the ascertained data signal. In addition, since the clock supply wiring and the clock buffer are built in each of the flip-flops, it is possible to completely remove clock skews which disturb the data signal acquiring timing due to the wiring extending from the clock buffer to the flip-flop. As a result, it is possible to completely prevent the malfunction of the circuit due to clock skews. In addition, the clock supply circuit in the fifth preferred embodiment of a data transfer circuit according to the present invention can achieve the above described function with simple construction and can be easily designed, so that the clock supply circuit can be applied to the design of various integrated circuits.

However, in order to cause each stage of flip-flop to acquire a predetermined data signal at each ting, it is a necessary condition that the total of the clock signal propagation delay times t in the respective stages of flip-flops is less than one period of the clock signal. That is, assuming that the number of stages of flip-flops is n and the period of the clock signal is T, and assuming that the clock delay path of the clock supply circuit is used every m stages of flip-flops, the condition nt/m<T must be met.

Therefore, assuming that the frequency of the clock signal is f, the upper limit of the frequency f of the clock signal is limited to the condition f<m/nt, so that the upper limit of the frequency f of the clock signal can be increased to be m times as large as the case where one stage of clock buffer of the clock supply circuit is added every one stage of flip-flop. Herein, assuming that the clock signal propagation delay time t=100 ps and the number n of stages of flip-flops is 100, and assuming that the clock delay path of the clock supply circuit is used for each 10 (m=10) stages of flip-flops, the upper limit of the frequency f of the clock signal is 1 GHz. In practice, it is considered that the upper limit of the frequency f of the clock signal is about 500 MHz due to the influence of the wiring delay.

Figure 14:
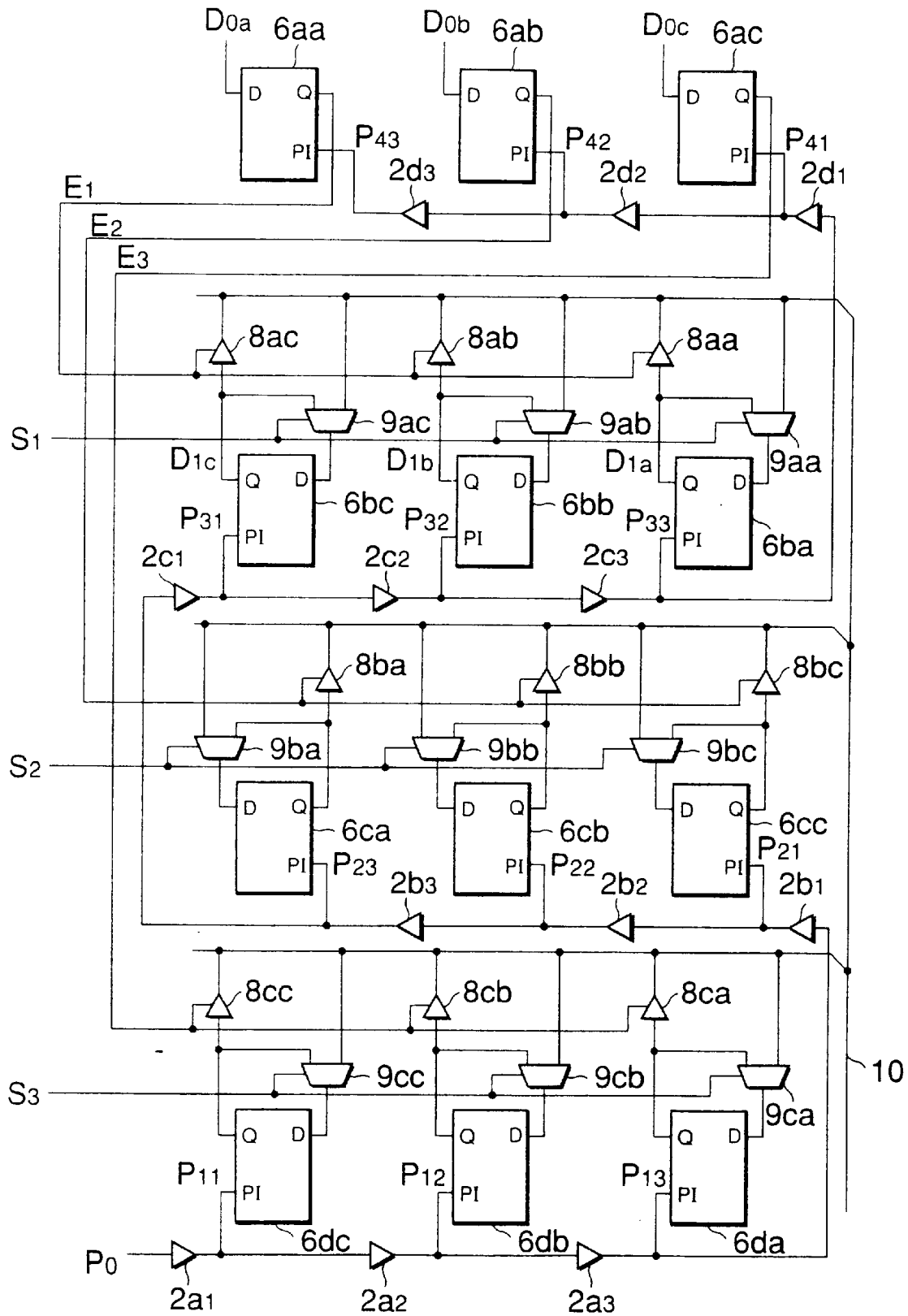
FIG. 14 is a block diagram of the sixth preferred embodiment of a data transfer circuit according to the present invention.
Figure 15:
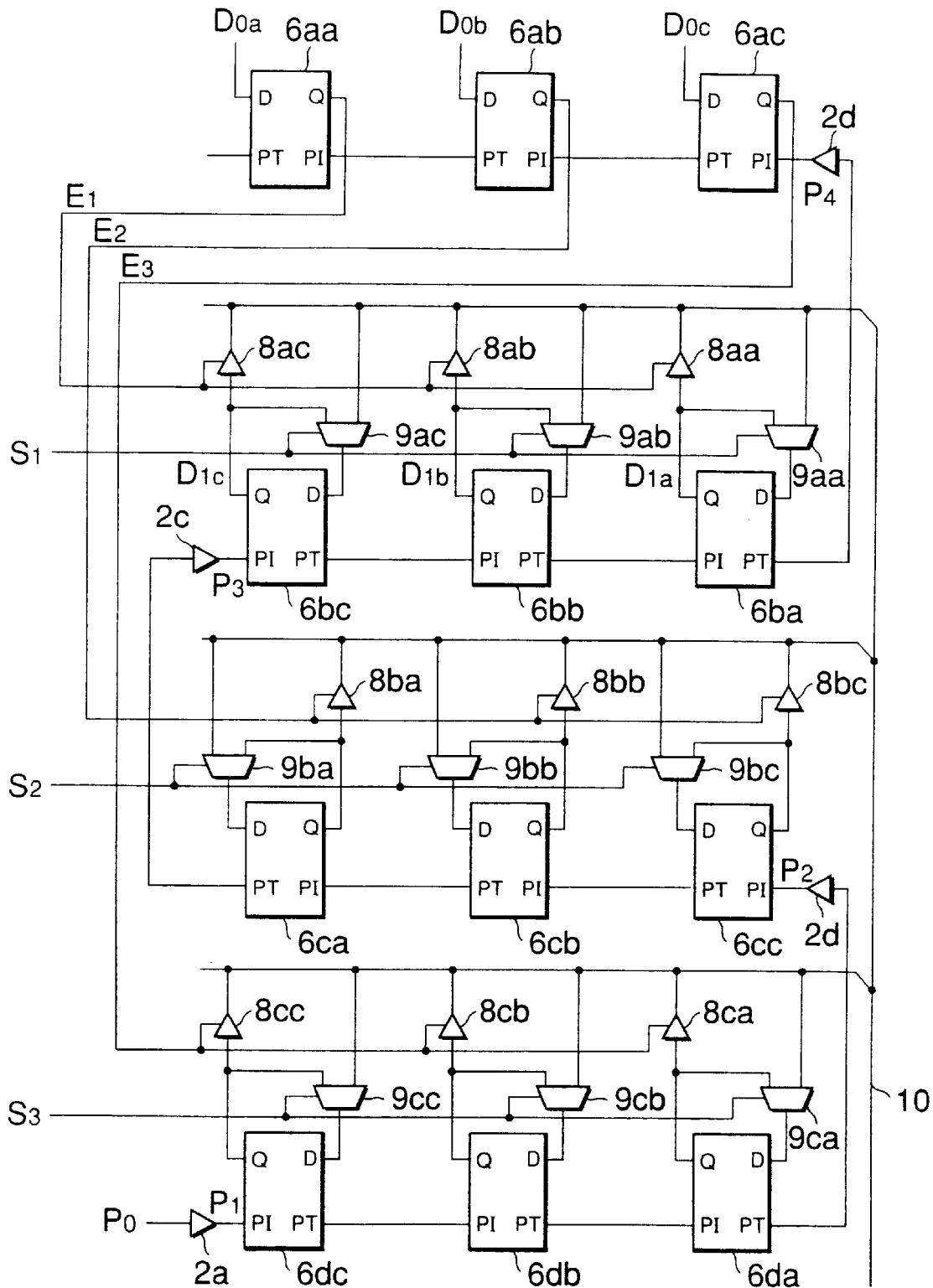
FIG. 15 is a block diagram of the seventh preferred embodiment of a data transfer circuit according to the present invention.

FIGS. 14 and 15 are block diagrams of the sixth and seventh preferred embodiments of a data transfer circuit according to the present invention. While the data transfer direction has been limited to one direction in the first through fifth preferred embodiments of a data transfer circuit according to the present invention, it is required to often transfer data between the respective flip-flops when the data transfer circuit is used in practice. Therefore, the sixth and seventh preferred embodiments are examples wherein data are transferred in both directions.

The sixth preferred embodiment of a data transfer circuit according to the present invention, which is shown in FIG. 14, comprises: flip-flops 6aa, 6ab and 6ac for inputting asynchronous output control signals D0a, D0b and D0c to output synchronous output control signals E1, E2 and E3, respectively; and flip-flops 6ba, 6bb, 6bc, 6ca, 6cb, 6cc, 6da, 6db and 6dc for mutually transferring data from and to other flip-flops.

To each of the data input nodes D of the flip-flops 6ba, 6bb, 6bc, 6ca, 6cb, 6cc, 6da, 6db and 6dc, a data output node Q thereof and a data bus 10 are connected via selectors 9aa, 9ab, 9ac, 9ba, 9bb, 9bc, 9ca, 9cb and 9cc, respectively. The data output nodes Q of the flip-flops 6ba, 6bb, 6bc, 6ca, 6cb, 6cc, 6da, 6db and 6dc are connected to the selectors 9aa, 9ab, 9ac, 9ba, 9bb, 9bc, 9ca, 9cb and 9cc and input nodes of try state buffers 8aa, 8ab, 8ac, 8ba, 8bb, 8bc, 8ca, 8cb and 8cc, respectively. The output nodes of the try state buffers 8aa, 8ab, 8ac, 8ba, 8bb, 8bc, 8ca, 8cb and 8cc are connected to the data bus 10. Furthermore, each of the flip-flops has the same construction as that of the flip-flop shown in FIG. 4. Synchronous output control signals E1 are inputted to the try state buffers 8aa, 8ab and 8ac, synchronous output control signals E2 are inputted to the try state buffers 8ba, 8bb and 8bc, and synchronous output control signals E3 are inputted to the try state buffers 8ca, 8cb and 8cc, respectively. Input control signals S1 are inputted to the selectors 9aa, 9ab and 9ac, input control signals S2 are inputted to the selectors 9ba, 9bb and 9bc, and input control signals S3 are inputted to the selectors 9ca, 9cb and 9cc, respectively.

On the other hand, first, second, third and fourth clock signals P11 through P13, P21 through P23, P31 through P33, and P41 through P43 are sequentially supplied from the clock supply circuit to flip-flops 6dc, 6db, 6da, 6cc, 6cb, 6ca, 6bc, 6bb and 6ba, which are provided for inputting and outputting data signals, and finally supplied to the flip-flops 6ac, 6ab and 6aa which are provided for outputting the synchronous output control signals E1, E2 and E2 of the try state buffers. That is, first stages of clock buffers 2a1, 2a2 and 2a3 are connected to the upstream sides of the clock input nodes PI of the flip-flops 6dc, 6db and 6da, respectively, and second stage of clock buffers 2b1, 2b2 and 2b3 are connected to the upstream sides of the clock input nodes PI of the flip-flops 6cc, 6cb and 6ca, respectively. In addition, third stages of clock buffers 2c1, 2c2 and 2c3 are connected to the upstream sides of the clock input nodes PI of the flip-flops 6bc, 6bb and 6ba, respectively. The first, second, third and fourth clock signals P11 through P13, P21 through P23, P31 through P33, and P41 through P43 are output signals of the first, second, third and fourth stages of clock buffers 2a1, 2a2, 2a3, 2b1, 2b2, 2b3, 2c1, 2c2, 2c3, 2d1, 2d2 and 2d3. The clock supply circuit in the sixth preferred embodiment corresponds the clock supply circuit in the first preferred embodiment shown in FIG. 3.

Clock signals sequentially phase-lagged by a predetermined time are inputted, every three stages of flip-flops, to each of the flip-flops forming the sixth preferred embodiment of a data transfer circuit according to the present invention, and the most phase-lagged clock signals are always inputted to the flip-flops 6ac, 6ab and 6aa, which output the synchronous output control signals E1, E2 and E3 of the try state buffers.

The flip-flops 6ba, 6bb and 6ac, or the flip-flops 6ca, 6cb and 6cc, or the flip-flops 6da, 6db and 6dc output data signals to the data bus 10 via the try state buffers 8aa, 8ab and 8ac, or the try state buffers 8ba, 8bb and 8bc, or the try state buffers 8ca, 8cb and 8cc, in accordance with the synchronous output control signals E1, E2 and E3, respectively. On the other hand, the flip-flops 6ba, 6bb and 6bc, or the flip-flops 6ca, 6cb and 6cc, or the flip-flops 6da, 6db and 6dc selectively acquire either data signals on the data bus 10 or data signals, which are outputted from the corresponding flip-flops themselves, via the selectors 9aa, 9ab and 9bc, or the selectors 9ba, 9bb and 9bc, or the selectors 9ca, 9cb and 9cc, in accordance with the input control signals S1, S2 and S3, respectively. Thus, data are transferred between the flip-flops, which have outputted the data signals to the data bus 10, and the flip-flops, which have acquired the data signals on the data bus 10.

The seventh preferred embodiment of a data transfer system according to the present invention, which is shown in FIG. 15, has a clock supply circuit different from that in the sixth preferred embodiment of a data transfer system according to the present invention, which is shown in FIG. 14. That is, in the seventh preferred embodiment of a data transfer system according to the present invention, which is shown in FIG. 15, a clock supply circuit for supplying first, second, third and fourth clock signals P1, P2, P3 and P4 comprises: a clock signal supply wiring for allowing clock signals to sequentially pass through flip-flops 6dc, 6db, 6da, 6cc, 6cb, 6ca, 6bc, 6bb and 6ba, which input and output data signals, to allow the clock signals to finally pass through flip-flops 6ac, 6ab and 6aa, which output synchronous output control signals E1, E2 and E3 of try state buffers; a first stage of clock buffers 2a, connected to the upstream side of the clock input node PI of the flip-flop 6dc, for inputting an input clock signal PO; a second stage of clock buffer 2b, provided between the clock passing node PT of the flip-flop 6da and the clock input node PI of the flip-flop 6cc; a third stage of clock buffer 2c provided between the clock passing node PT of the flip-flop 6ca and the clock input node PI of the flip-flop 6bc; and a fourth stage of clock buffer 2d provided between the clock passing node PT of the flip-flop 6ba and the clock input node PI of the flip-flop 6ac. The first, second, third and fourth clock signals P1, P2, P3 and P4 are output signals of the first, second, third and fourth stages of clock buffers 2a, 2b, 2c and 2d, respectively. The clock supply circuit for use in the seventh preferred embodiment of a data transfer system according to the present invention corresponds to the clock supply circuit for use in the second preferred embodiment of a data transfer circuit according to the present invention, which is shown in FIG. 6.

In the sixth and seventh preferred embodiment of a data transfer circuit according to the present invention, the phases of the clock signals inputted to the flip-flops 6ac, 6ab and 6aa for outputting the synchronous output control signals E1, E2 and E3 for controlling the outputs of the data signals to the data bus are always lagged from the phases of the clock signals inputted to the respective flip-flops for mutually transferring data. Therefore, the respective flip-flops for mutually transferring data signals can acquire predetermined data signals before the data signals on the data bus vary, so that it is possible to completely prevent the malfunction of the circuit due to clock skews. In addition, the clock supply circuits in the sixth and seventh preferred embodiments of a data transfer circuit according to the present invention can achieve the above described function with simple construction and can be easily designed, so that the clock supply circuits can be applied to the design of various integrated circuits.

As described above in detail, according to a first aspect of the present invention, there is provided a clock supply circuit for supplying clock signals to a data transfer circuit, which comprises a plurality of stages of cascade-connected data signal input/output circuits and wherein the plurality of stages of data signal input/output circuits from a data signal input stage to a data signal output stage are divided into a plurality of groups, each including predetermined stages of the data signal input/output circuits, the clock supply circuit supplying a more phase-lagged clock signal to a data signal input/output circuit belonging to a group nearer the data signal input stage of the plurality of stages of data signal input/output circuit out of the plurality of groups. Therefore, the phase of the clock signal inputted to the transmit side data signal input/output circuit does not pass the phase of the clock signal inputted to the receive side data signal input/output circuit, so that each of the data signal input/output circuits can always acquire the ascertained data signal. As a result, it is possible to prevent the malfunction of the circuit due to clock skews.

In a clock supply circuit according to a second aspect of the present invention, the phase of a clock signal inputted to an output control signal generating circuit for outputting an output control signal for controlling the output of a data signal to a data bus is always lagged from the phase of a clock signal inputted to each of data signal input/output circuits for mutually transferring a data signal. Therefore, each of the data signal input/output circuits for mutually transferring a data signal can acquire a predetermined data signal before the data signal on the data bus varies, so that it is possible to completely prevent the malfunction of the circuit due to clock skews.

According to a third aspect of the present invention, a data transfer circuit comprises: a plurality of stages of cascade-connected data signal input/output circuits, the plurality of stages of data signal input/output circuits from a data signal input stage to a data signal output stage being divided into a plurality of groups, each including predetermined stages of the data signal input/output circuits; and a clock supply circuit for supplying a more phase-lagged clock signal to the data signal input/output circuit belonging to a group nearer the data signal input stage of the plurality of stages of data signal input/output circuit out of the plurality of groups. Therefore, the phase of the clock signal inputted to the transmit side data signal input/output circuit does not pass the phase of the clock signal inputted to the receive side data signal input/output circuit, so that each of the data signal input/output circuits can always acquire the ascertained data signal. As a result, it is possible to prevent the malfunction of the circuit due to clock skews.

In a data transfer circuit according to a fourth aspect of the present invention, the phase of a clock signal inputted to an output control signal generating circuit for outputting an output control signal for controlling the output of a data signal to a data bus is always lagged from the phase of a clock signal inputted to each of data signal input/output circuits for mutually transferring a data signal. Therefore, each of the data signal input/output circuits for mutually transferring a data signal can acquire a predetermined data signal before the data signal on the data bus varies, so that it is possible to completely prevent the malfunction of the circuit due to clock skews. In addition, the clock supply circuit of the data transfer circuit according to the fourth aspect of the present invention can achieve the above described function with simple construction and can be easily designed, so that the clock supply circuit can be applied to the design of various integrated circuits.

The clock supply circuit and the data transfer circuit according to the present invention can achieve the above described function with simple constructions and can be easily designed, so that these circuits can be applied to the design of various integrated circuits.

In the clock supply circuit and the data transfer circuit according to the present invention, if the phase difference between the most phase-advanced clock signal and the most phase-lagged clock signal, out of the plurality of clock signals, each of which is supplied so as to have the phase difference from each other, on the basis of the input clock signal is less than one period of the input clock signal, each stage of data signal input/output circuit can acquire a predetermined data signal at each timing.

If the clock signal supply wiring for supplying clock signals to a plurality of stages of data signal input/output circuits passes through the plurality of stages of data signal input/output circuits, or part or all of a plurality of stages of buffers are provided in a plurality of stages of data signal input/output circuits, it is possible to prevent clock skews from being caused by the difference in wiring length from the clock buffers to the data signal input/output circuits or the like, so that it is possible to completely prevent the malfunction of the circuit due to clock skews.

What is claimed is:

1. A clock supply circuit for supplying clock signals to a data transfer circuit, comprising:

a plurality of stages of cascade-connected data signal input/output circuits and wherein said plurality of stages of data signal input/output circuits from a data signal input stage to a data signal output stage are divided into a plurality of groups, each including predetermined stages of said data signal input/output circuits;

wherein said clock supply circuit has a plurality of stages of buffers connected in series, said clock supply circuit supplying a clock signal, which is one of a plurality of clock signals derived from any one of said plurality of stages of buffers on the basis of an input clock signal and which is derived via a more number of stages of buffers, to a data signal input/output circuit belonging to a group nearer said data signal input stage of said plurality of stages of data signal input/output circuits out of said plurality of groups;

wherein said clock signal is propagated in a reverse direction of the data signal; and wherein said plurality of clock signals have phase differences with respect to each other based on the input clock signal and include a most phase-advanced clock signal and a most phase-lagged signal, and the phase difference between the most phase-advanced clock signal and the most phase-lagged signal is less than one period of said input clock signal.

2. A clock supply circuit as set forth in claim 1, wherein a clock signal supply wiring for supplying said clock signals to said plurality of stages of data signal input/output circuit is provided so as to pass through said plurality of stages of data signal input/output circuits.

3. A clock supply circuit as set forth in claim 1, wherein part or all of said plurality of stages of buffers are provided in said plurality of stages of data signal input/output circuits.

4. A clock supply circuit for supplying clock signals to each of a plurality of stages of data signal input/output circuits and an output control signal generating circuit of a data transfer circuit, comprising:

a plurality of stages of data signal input/output circuits divided into plurality of groups, each including predetermined stages of said data signal input/output circuits;

a data bus serving as a transfer path for a data signal outputted from one of said data signal input/output circuits belonging to any one of said groups;

an output control signal generating circuit, provided in each of said groups, for generating an output control signal for controlling said data signal outputted from said one of said data signal input/output circuits to said data bus for each of said groups; and a data signal selecting circuit for selecting any one of a data signal on said data bus and said data signal outputted from said one of said data signal input/output circuits, as a data signal to be inputted to said one of said data signal input/output circuits, wherein said clock supply circuit has a plurality of stages of buffers connected in series, said clock supply circuit a clock signal, which is one of plurality of clock signals derived from any one of said plurality of stages of buffers on the basis of an input clock signal and which is derived via a most number of stages of buffers, to said output control signal generating circuit;

wherein said clock signal is propagated in a reverse direction of the data signal; and wherein said plurality of clock signals have phase differences with respect to each other based on the input clock signal and include a most phase-advanced clock signal and a most phase-lagged signal, and the phase difference between the most phase-advanced clock signal and the most phase-lagged signal is less than one period of said input clock signal.

5. A clock supply circuit as set forth in claim 4, wherein a clock signal supply wiring for supplying said clock signals to said plurality of stages of data signal input/output circuit is provided so as to pass through said plurality of stages of data signal input/output circuits.

6. A clock supply circuit as set forth in claim 4, wherein part or all of said plurality of stages of buffers are provided in said plurality of stages of data signal input/output circuits.

7. A data transfer circuit comprising:

a plurality of stages of cascade-connected data signal input/output circuits, said plurality of stages of a data signal input/output circuits from a data signal input stage to a data signal output stage being divided into a plurality of groups, each including predetermined stages of said data signal input/output circuits; and a clock supply circuit comprising a plurality of stages of buffers connected in series, said clock supply circuit supplying a clock signal, which is one of a plurality of clock signals derived from any one of said plurality of stages of buffers on the basis of an input clock signal and which is derived via a more number of stages of buffers, to said data signal input/output circuit belonging to a group nearer said data signal input stage of said plurality of stages of data signal input/output circuit out of said plurality of groups;

wherein said clock signal is propagated in a reverse direction of the data signal; and wherein said plurality of clock signals have phase differences with respect to each other based on the input clock signal and include a most phase-advanced clock signal and a most phase-lagged signal, and the phase difference between the most phase-advanced clock signal and the most phase-lagged signal is less than one period of said input clock signal.

8. A data transfer circuit as set forth in claim 7, wherein said clock supply circuit has a clock signal supply wiring for supplying said clock signals to said plurality of stages of data signal input/output circuit, said clock signal supply wiring being provided so as to pass through said plurality of stages of data signal input/output circuits.

9. A data transfer supply circuit as set forth in claim 7, wherein part or all of said plurality of stages of buffers forming said clock supply circuit are provided in said plurality of stages of data signal input/output circuits.

10. A data transfer circuit comprising:

a plurality of stages of data signal input/output circuits divided into a plurality of groups, each including predetermined stages of said data signal input/output circuits;

a data bus serving an a transfer path for a data signal outputted from one of said data signal input/output circuits belonging to any one of said groups;

an output control signal generating circuit, provided in each of said groups, for generating an output control signal for controlling said data signal outputted from said one of said data signal input/output circuits to said data bus for each of said groups;

a data signal selecting circuit for selecting any one of a data signal on said data bus and said data signal outputted from said one of said data signal input/output circuits, as a data signal to be inputted to said one of said data signal input/output circuits; and a clock supply circuit comprising a plurality of stages of buffers connected in series, said clock supply circuit supplying a clock signal, which is one of a plurality of clock signals derived from any one of said plurality of stages of buffers on the basis of an input clock signal and which is derived via a most number of stages of buffers, to said output control signal generating circuit;

wherein said clock signal is propagated in a reverse direction of the data signal; and wherein said plurality of clock signals have phase differences with respect to each other based on the input clock signal and include a most phase-advanced clock signal and a most phase-lagged signal, and the phase difference between the most phase-advanced clock signal and the most phase-lagged signal is less than one period of said input clock signal.

11. A data transfer circuit as set forth in claim 10, wherein said clock supply circuit has a clock signal supply wiring for supplying said clock signals to said plurality of stages of data signal input/output circuit, said clock signal supply wiring being provided so as to pass through said plurality of stages of data signal input/output circuits.

12. A data transfer supply circuit as set forth in claim 10, wherein part or all of said plurality of stages of buffers forming said clock supply circuit are provided in said plurality of stages of data signal input/output circuits.

* * * * *

UNITED STATES PATENT AND TRADEMARK OFFICE
CERTIFICATE OF CORRECTION

PATENT NO.    : 6,377,077 B1
DATED         : April 23, 2002
INVENTOR(S)   : Mikio Shiraishi It is certified that error appears in the above-identified patent and that said Letters Patent is hereby corrected as shown below:

This certificate supersedes Certificate of Correction issured March 19, 2002, the number was erroneously mentioned and should be deleted since no Certificate of Correction was granted.

Signed and Sealed this

Fourth Day of June, 2002

*Attest:*

*Attesting Officer*

JAMES E. ROGAN
*Director of the United States Patent and Trademark Office*